Figure 1:
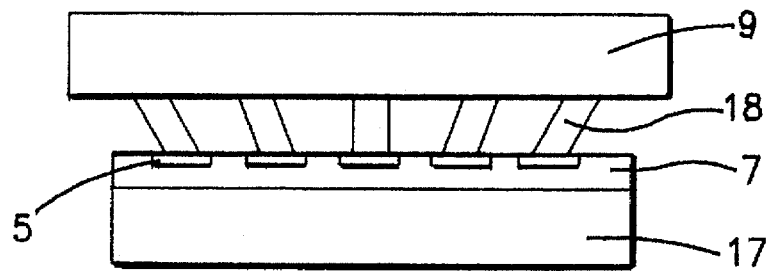

United States Patent [19]

Kanzaki

[11] Patent Number: 5,696,377
[45] Date of Patent: Dec. 9, 1997

[54] HYBRID INFRARED RAY DETECTOR WITH AN IMPROVED BONDING STRUCTURE BETWEEN AN SI-SUBSTRATE HAVING INTEGRATED CIRCUITS AND AN HGCDTE LAYER HAVING TWO-DIMENSIONAL PHOTODIODE ARRAYS AND METHOD FOR FABRICATING THE SAME

[75] Inventor: Masayuki Kanzaki, Tokyo, Japan

[73] Assignee: NEC Corporation, Tokyo, Japan

[21] Appl. No.: 631,966

[22] Filed: Apr. 15, 1996

[30] Foreign Application Priority Data

Apr. 14, 1995 [JP] Japan ................. 7-089525

[51] Int. Cl.$^6$ ................................. H01L 27/146
[52] U.S. Cl. ................. 250/338.4; 250/332; 250/370.08; 250/370.13
[58] Field of Search ............... 250/338.4, 370.13, 250/370.08, 332

[56] References Cited

U.S. PATENT DOCUMENTS

| | | | |
|---|---|---|---|
| 4,039,833 | 8/1977 | Thom | 250/332 |
| 4,943,491 | 7/1990 | Norton et al. | |
| 5,095,216 | 3/1992 | Walsh | 250/338.4 |
| 5,264,699 | 11/1993 | Barton et al. | 250/338.4 |
| 5,308,980 | 5/1994 | Barton | 250/338.4 |
| 5,365,088 | 11/1994 | Myrosznyk | |

FOREIGN PATENT DOCUMENTS 2 660 798  10/1991  France .

OTHER PUBLICATIONS by T. Kanno et al., "A 256×256 Element HgCdTe Hybrid IRFPA for 8–10 μm Band", *SPIE*, vol. 2552, pp. 384–391. (Jul. 1995?).

*Primary Examiner*—Constantine Hannaher
*Attorney, Agent, or Firm*—Young & Thompson

[57] ABSTRACT

A hybrid infrared ray detector includes a first semiconductor substrate which has a first thickness and a first elastic coefficient. A buffer layer is provided on the first semiconductor substrate which is made of a first compound semiconductor having a second elastic coefficient larger than the first elastic coefficient and which has a second thickness smaller than the first thickness. An epitaxial layer is provided on the buffer layer. The epitaxial layer is made of a second compound semiconductor having a third elastic coefficient smaller than the second elastic coefficient and larger than the first elastic coefficient and which has a third thickness which is almost the same as the second thickness. Two-dimensional arrays of photodiodes are provided on a surface of the epitaxial layer. First bumps are provided on the photodiodes. Second bumps are provided on the surface of the epitaxial layer. The second bumps are positioned outside the two-dimensional arrays of the photodiodes. A second semiconductor substrate is provided which has integrated circuits, and third bumps positioned to correspond to the first bumps and fourth bumps positioned to correspond to the second bumps. The second semiconductor substrate is bonded via the first to the fourth bumps to the epitaxial layer. The second semiconductor substrate has a fourth thickness which is almost the same as the first thickness, and a fourth elastic coefficient which is almost the same as the first elastic coefficient. The first to fourth thickness and the first to fourth elastic coefficients are determined that a thermal stress caused by cooling the hybrid infrared ray detector is concentrated within the buffer layer.

14 Claims, 3 Drawing Sheets

HYBRID INFRARED RAY DETECTOR WITH AN IMPROVED BONDING STRUCTURE BETWEEN AN SI-SUBSTRATE HAVING INTEGRATED CIRCUITS AND AN HGCDTE LAYER HAVING TWO-DIMENSIONAL PHOTODIODE ARRAYS AND METHOD FOR FABRICATING THE SAME

BACKGROUND OF THE INVENTION

The present invention relates to a hybrid infrared my detector, and more particularly to a hybrid infrared ray detector with an improved bonding structure between an Si substrate having integrated circuits and an HgCdTe layer having two-dimensional photodiode arrays and a method for fabricating the same.

Practicable infrared ray detectors are required to be sensitive to infrared rays having a wavelength in the range of 3–5 micrometers or in the range of 8–14 micrometers since the infrared ray shows a high transmittivity in an atmosphere. It has been known in the art to which the invention pertains that various compound semiconductors such as InAs, InSb, HgCdTe and PbSnTe have energy band gaps which correspond to the above wavelength ranges. Particularly, HgCdTe is superior because an infrared ray detector having HgCdTe photodiode arrays is highly sensitive to infrared rays of wavelengths in the range of a few micrometers and about 10 micrometers. Two-dimensional HgCdTe photodiode array structure is suitable for the hybrid infrared ray detector. In the above circumstances, a development has been influential of a hybrid infrared ray detector having two-dimensional HgCdTe photodiode arrays.

The two-dimensional HgCdTe photodiode arrays are formed on an HgCdTe epitaxial layer. The HgCdTe epitaxial layer is formed on a substrate such as a CdTe substrate, a GaAs substrate and an Si substrate to form a photodiode array substrate. On the other hand, the integrated circuits are normally formed on an Si substrate to form a Si IC substrate.

The photodiode array substrate and the Si IC substrate are mechanically and electrically bonded to each other via bumps to form a hybrid structure. The hybrid infrared ray detector is cooled in use to 77K which is a liquid nitrogen temperature. Since HeCdTe and Si differs in thermal expansion coefficient, a thermal stress is caused in the hybrid structure. A large thermal stress in the hybrid structure causes a deterioration in performances of the infrared ray detector.

FIG. 1 illustrates a first conventional hybrid infrared ray detector wherein a thermal stress is caused due to cooling the hybrid infrared ray detector. The hybrid infrared ray detector is designed to compensate the thermal stress due to the cooling by a thermal strain of flexible bumps of a high aspect ratio. An HgCdTe epitaxial layer 7 is provided on a CdTe substrate 17. Two-dimensional photodiode arrays 5 are provided on a surface of the HgCdTe epitaxial layer 7. Integrated circuits are provided on a Si substrate 9. The CdTe substrate 17 is bonded to the Si substrate 9 via In bumps 18 of a high aspect ratio to form the hybrid structure.

When the hybrid infrared ray detector is cooled, then the Si substrate 9 and the CdTe substrate 17 show different amounts of cooling contractions. However, such difference in cooling contraction between the Si substrate 9 and the CdTe substrate 17 is somewhat compensated by a strain of the In bumps 18.

Figure 2:
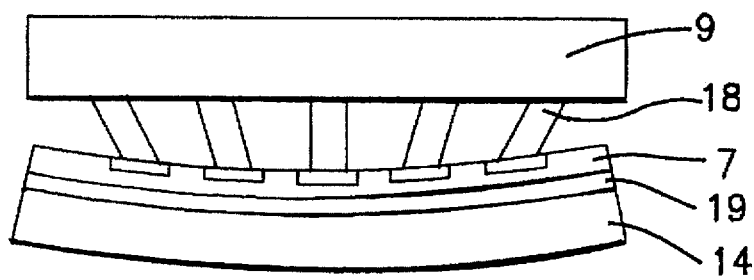

A second conventional hybrid infrared ray detector is illustrated in FIG. 2, wherein hybrid infrared ray detector is designed to reduce a thermal stress due to the cooling thereof. A CdTe buffer layer 19 is formed on a Si substrate 14. An HgCdTe layer 7 is provided on the CdTe buffer layer 19. The HgCdTe layer 7 has almost the same thickness as the CdTe buffer layer 19. Two-dimensional photodiode arrays 5 are provided on a surface of the HgCdTe epitaxial layer 7. Integrated circuits are provided on a Si substrate 9. The Si substrate 14 is bonded to the Si substrate 9 via In bumps 18 of a high aspect ratio to form the hybrid structure.

When the hybrid infrared ray detector is cooled then the Si substrate 9 and the Si substrate 14 show the same amount of cooling contraction. However, the CdTe buffer layer 19 and the HgCdTe layer 7 show different amounts of the cooling contraction from the Si substrate 14. Such difference in cooling contraction between the Si substrate 14 and the CdTe buffer layer 19 or the HgCdTe layer 7 causes that the laminated structure of the HgCdTe layer 7, the CdTe buffer layer 19 and the Si substrate 14 is slightly bent so that the opposite end portions thereof becomes closer to the Si substrate 9 and the center portion becomes apart from the Si substrate 9 as illustrated in FIG. 2.

The above first and second conventional hybrid infrared ray detectors are engaged with the following problems. Recently, a requirement for a high definition image of the infrared ray detection has been on the increase. In order to satisfy the requirement for the high definition image of the infrared ray detection, it is required to enlarge an area of the photodiode arrays. The enlargement in area of the photodiode arrays necessarily requires an enlargement in area of the HgCdTe layer. The enlargement in area of the photodiode arrays and the HgCdTe layer raises a problem with an increase of the thermal stress applied to the In bumps 18 particularly at a peripheral region. To prevent excess increase in thermal stress of the In bumps 18, it is then required to enlarge the aspect ratio of the In bumps 18. The enlargement in aspect ratio of the In bumps 18, however, raises another problem with decrease in bonding strength of the In bumps 18. In the bonding process, In bumps are separately formed both on the Si substrate 9 and on the two-dimensional photodiode arrays 5. Thereafter, the In bumps provided on the Si substrate 9 are adhered under a pressure to the In bumps provided on the two-dimensional photodiode arrays 5. In order to keep the high aspect ratio of the In bumps 18, it is required to suppress raising of both the bonding temperature and the bonding pressure, whereas the high bonding temperature and the high bonding pressure are required to obtain a large mechanical strength of the In bumps. For those reasons, it is difficult to obtain both the large mechanical strength and the high aspect ratio of the In bumps 18.

Further, the second conventional hybrid infrared ray detector is engaged with the following problem. When the hybrid infrared ray detector is cooled to be operated, an internal stress is generated over the laminated structure of the HgCdTe layer 7, the CdTe buffer layer 19 and the Si substrate 14. If the Si substrate 14 is designed to have a thickness of about 500 micrometers in view of facilitation of processing the same, then the internal stress is concentrated on a surface of the HgCdTe layer 7. This means that the internal stress is concentrated at the photodiods 5. On the other hand, in order to prevent the internal stress concentration at the photodiods 5, the Si substrate 14 may be designed to have a thickness of about 25 micrometers. In this case, however, the internal stress is concentrated on an interface between the CdTe buffer layer 19 and the Si substrate 14. Such internal stress concentration on the interface between the CdTe buffer layer 19 and the Si substrate 14 may cause peeling between them.

In the above circumstances, it had been required to develop a quite novel hybrid infrared ray detector with an improved bonding structure which makes the detector free from any problems as described above.

SUMMARY OF THE INVENTION

Accordingly, it is an object of the present invention to provide a novel hybrid infrared ray detector with an improved bonding structure which makes the detector free from any problems as described above.

It is a further object of the present invention to provide a novel hybrid infrared ray detector with an improved bonding structure which provides a large mechanical strength of the bonding.

It is a still further object of the present invention to provide a novel hybrid infrared ray detector with an improved bonding structure which reduces a thermal stress caused by cooling of the detector in use.

It is a still further object of the present invention to provide a novel hybrid infrared ray detector with an improved bonding structure which suppresses a crystal deformation of an epitaxial layer included in the detector.

It is yet a further object of the present invention to provide a novel hybrid infrared ray detector with an improved bonding structure which suppresses any deterioration in performance of photodiodes included in the detector.

It is a furthermore object of the present invention to provide a novel hybrid infrared ray detector with a high reliability.

It is still more an object of the present invention to provide a novel hybrid infrared ray detector showing excellent performance.

It is moreover an object of the present invention to provide a novel hybrid infrared my detector with an improved bonding structure which suppresses any peeling of layers included in the detector.

It is another object of the present invention to provide a method for fabricating a novel hybrid infrared ray detector with an improved bonding structure which makes the detector free from any problems as described above.

It is still another object of the present invention to provide a method for fabricating a novel hybrid infrared ray detector at a high yield.

The above and other objects, features and advantages of the present invention will be apparent from the following descriptions.

The present invention provides a hybrid infrared ray detector which comprises the following elements. A first semiconductor substrate is provided which has a first thickness and a first elastic coefficient. A buffer layer is provided on the first semiconductor substrate. The buffer layer is made of a first compound semiconductor having a second elastic coefficient larger than the first elastic coefficient. The buffer layer has a second thickness smaller than the first thickness. An epitaxial layer is provided on the buffer layer. The epitaxial layer is made of a second compound semiconductor having a third elastic coefficient smaller than the second elastic coefficient and larger than the first elastic coefficient. The epitaxial layer has a third thickness which is almost the same as the second thickness. Two-dimensional arrays of photodiodes are provided on a surface of the epitaxial layer. First bumps are provided on the photodiodes. Second bumps are provided on the surface of the epitaxial layer. The second bumps are positioned outside the two-dimensional arrays of the photodiodes. A second semiconductor substrate is provided which has integrated circuits. The second semiconductor substrate has third bumps positioned to correspond to the first bumps and fourth bumps positioned to correspond to the second bumps. The second semiconductor substrate is bonded via the first to fourth bumps to the epitaxial layer. The second semiconductor substrate has a fourth thickness which is almost the same as the first thickness. The second semiconductor substrate has a fourth elastic coefficient which is almost the same as the first elastic coefficient. The first to fourth thickness and the first to fourth elastic coefficients are so determined that a thermal stress caused by cooling the hybrid infrared ray detector in operation is concentrated within the buffer layer.

BRIEF DESCRIPTIONS OF THE DRAWINGS

Figure 3:
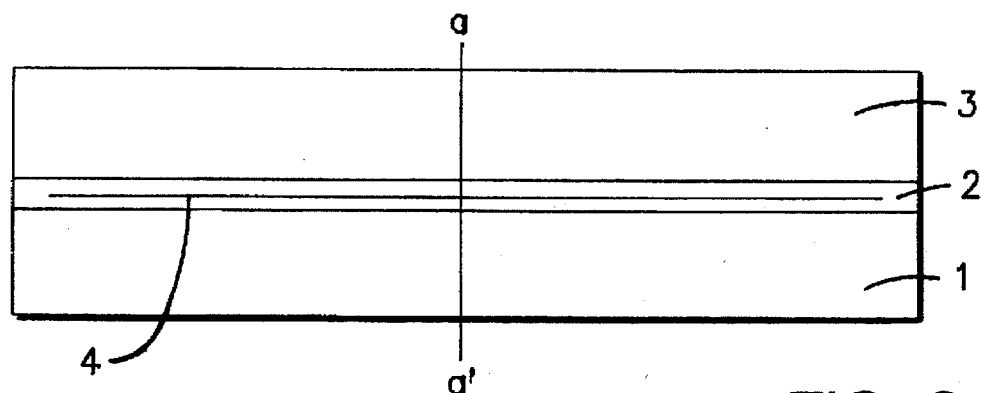
Figure 5:
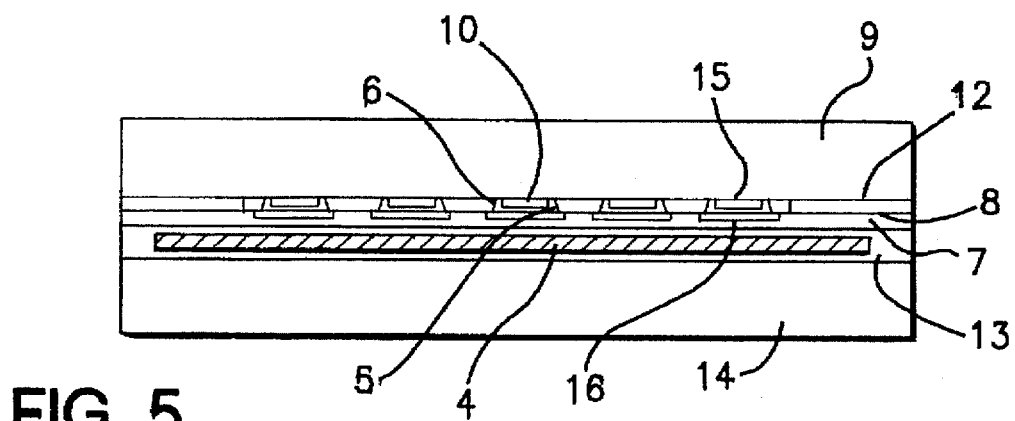
Figure 4:
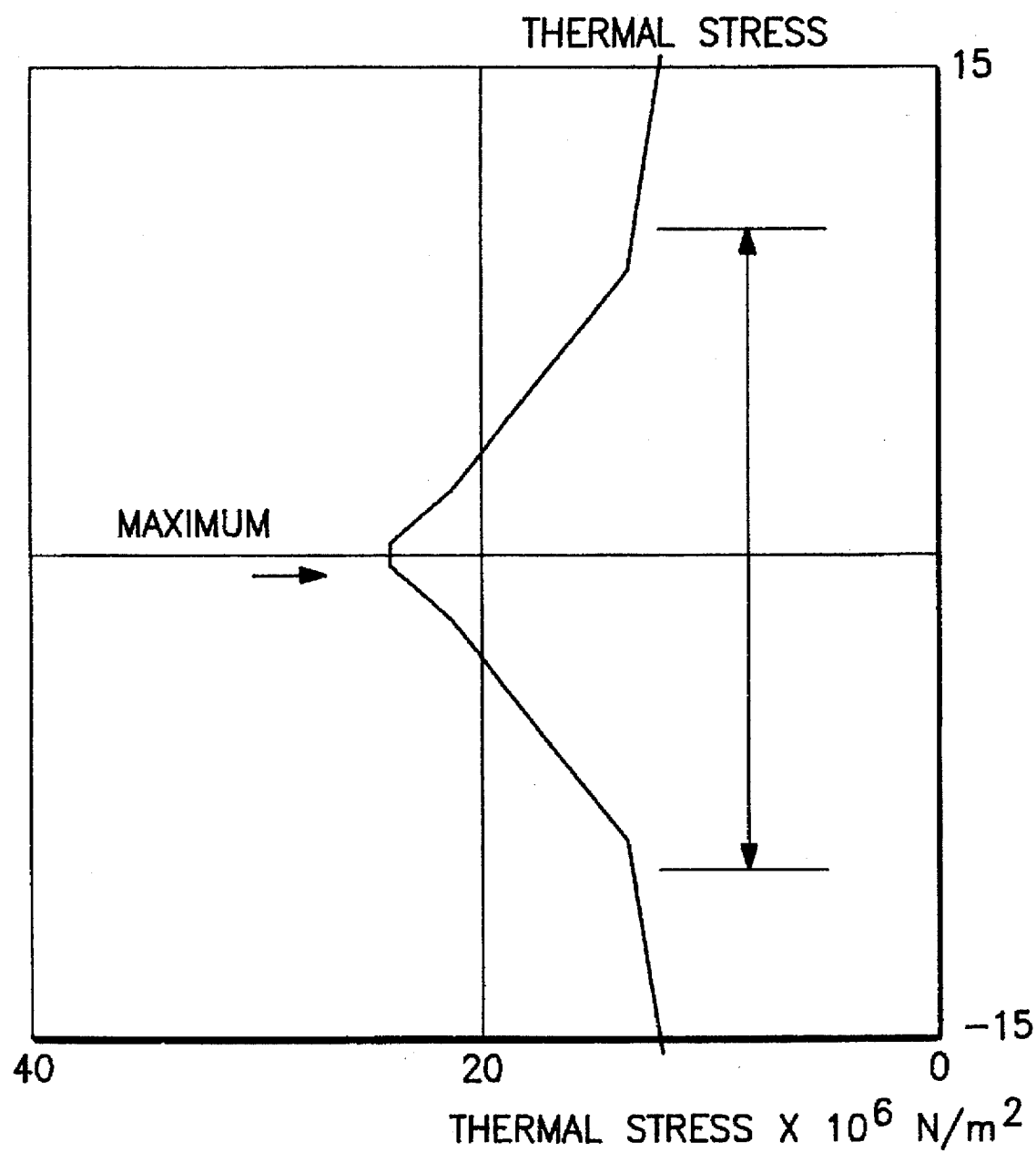
Figure 6A:
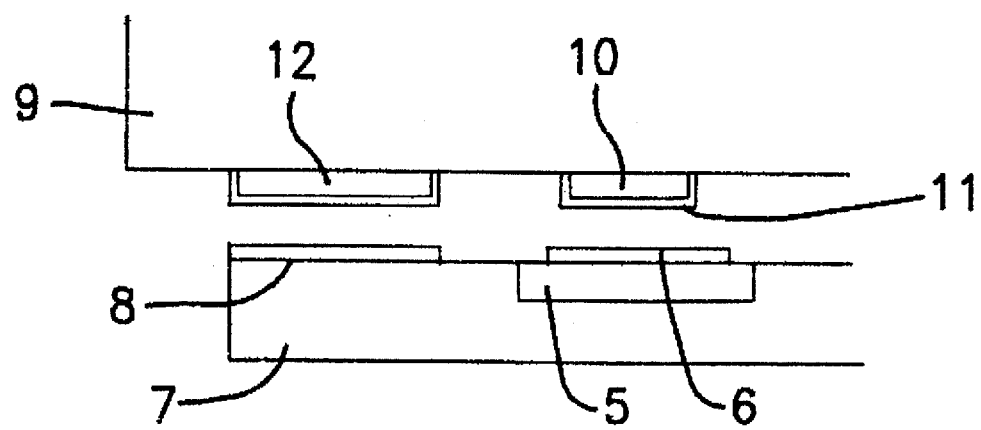
Figure 6B:
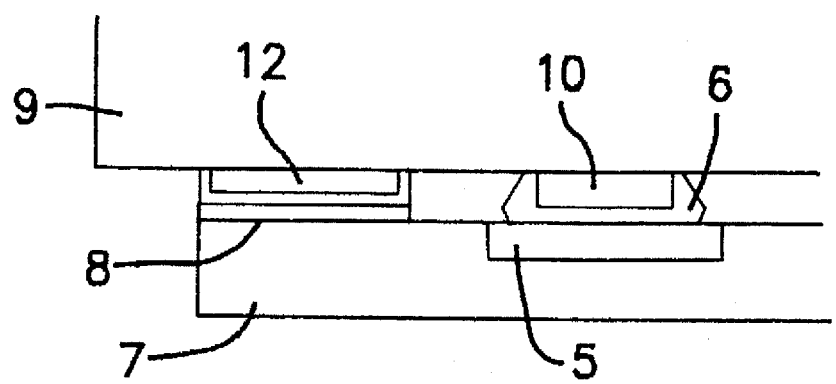

Preferred embodiments of the present invention will be described in detail with reference to the accompanying drawings, FIG. 1 is a cross sectional elevation view illustrative of the first conventional hybrid infrared ray detector, FIG. 2 is a cross sectional elevation view illustrative of the second conventional hybrid infrared ray detector, FIG. 3 is a lamination layered structure which is similar to a structure of a novel hybrid infrared ray detector according to the present invention, FIG. 4 is a diagram illustrative of variations in thermal stress caused by cooling the lamination layered structure of FIG. 3 versus a distance from a center axis, FIG. 5 is a cross sectional elevation view illustrative of a novel hybrid infrared ray detector according to the present invention, FIG. 6A is a cross sectional elevation view illustrative of a novel hybrid infrared ray detector before bonding process according to the present invention, FIG. 6B is a cross sectional elevation view illustrative of a novel hybrid infrared ray detector after bonding process according to the present invention,

DISCLOSURE OF THE INVENTION

The present invention provides a hybrid infrared ray detector which comprises the following elements. A first semiconductor substrate is provided which has a first thickness and a first elastic coefficient. A buffer layer is provided on the first semiconductor substrate. The buffer layer is made of a first compound semiconductor having a second elastic coefficient larger than the first elastic coefficient. The buffer layer has a second thickness smaller than the first thickness. An epitaxial layer is provided on the buffer layer. The epitaxial layer is made of a second compound semiconductor having a third elastic coefficient smaller than the second elastic coefficient and larger than the first elastic coefficient. The epitaxial layer has a third thickness which is almost the same as the second thickness. Two-dimensional arrays of photodiodes are provided on a surface of the epitaxial layer. First bumps are provided on the photodiodes. Second bumps are provided on the surface of the epitaxial layer. The second bumps are positioned outside the two-dimensional arrays of the photodiodes. A second semiconductor substrate is provided which has integrated circuits. The second semiconductor substrate has third bumps positioned to correspond to the first bumps and fourth bumps positioned to correspond to the second bumps. The second semiconductor substrate is bonded via the first to fourth bumps to the epitaxial layer. The second semiconductor substrate has a fourth thickness which is almost the same as the first thickness. The second semiconductor substrate has a fourth elastic coefficient which is almost the same as the first elastic coefficient. The first to fourth thickness and the first to fourth elastic coefficients are so determined that a thermal stress caused by cooling the hybrid infrared ray detector in operation is concentrated within the buffer layer.

The first and second semiconductor substrates may be made of silicon. The buffer layer may be made of CdTe. The epitaxial layer may be made of HgCdTe. The first bumps may be made of In. The second bumps may be made of CdTe. The third and fourth bumps may be made of polysilicon highly doped. The third and fourth bumps may be coated with thin films made of In. The second and fourth bumps may have areas which are four times larger than areas of the first and third bumps.

A first substrate is prepared, on which an epitaxial layer made of compound semiconductors is provided. Two dimensional photodiode arrays are formed on a surface of the epitaxial layer. A second substrate is prepared which has integrated circuits. The first and second substrate are made of silicon and have almost the same thickness. The first and second substrates are bonded to each other via bumps which have a low flexibility. The bumps are provided on the photodiodes. The bumps have a low aspect ratio to ensure a strong mechanical bonding which prevent that the first and second substrates are bent.

FIG. 3 illustrates a lamination structure of an Si layer 1, a CdTe layer 2 and an Si layer 3, wherein the CdTe layer is sandwiched between the Si layers 1 and 3. If the Si layers 1 and 3 have almost the same thickness, almost no bending is caused over the lamination structure. The thermal stress applied to the lamination structure varies over positions along an a–a' axis. The variation in the thermal stress of the lamination structure is illustrated in FIG. 4. If the Si layers 1 and 3 have the same thickness, then the distribution of the thermal stress has a maximum value at a center axis 4 in the CdTe layer 2 between the interfaces of the CdTe layer 2 to the Si substrates 1 and 3. The thermal stress distribution is symmetrical to the center axis 4 and is reduced gradually as the distance from the center axis increases. When the thickness of the Si substrates 1 and 3 is increased, then the concentration of the thermal stress at the center axis 4 is increased.

The infrared ray detector has a hybrid structure similar to the above lamination structure. The hybrid infrared ray detector comprises an Si substrate, a CdTe buffer layer provided on the Si substrate, a HgCdTe layer provided on the CdTe buffer layer, two-dimensional photodiode arrays provided on the surface of the HgCdTe layer, the bumps provided on the two-dimensional photodiode arrays and a Si substrate having integrated circuits and bonded to the HgCdTe layer via the bumps.

If the above hybrid infrared ray detector is cooled, then almost no bending is caused over the above hybrid structure. HgCdTe has a Young coefficient having almost no difference from that of CdTe. CdTe has a larger thermal expansion coefficient than that of HgCdTe. The CdTe buffer layer has a larger thickness than that of the HgCdTe layer so that the thermal stress has a maximum value within the CdTe buffer layer. The CdTe buffer layer has a larger elastic limitation than that of the HgCdTe layer. This allows that the thermal stress caused over the CdTe buffer layer is below a maximum value of the elastic limitation. No crystal deformation is caused in the CdTe buffer layer. A reduced thermal stress is applied on the surface of the HgCdTe layer and on the interface between the CdTe buffer layer and the Si substrate.

Embodiments

A preferred embodiment according to the present invention will be described in detail with reference to FIGS. 5 and 6A–6B, wherein a hybrid infrared ray detector is provided. A CdTe buffer layer 13 having a thickness of 20 micrometers is provided on an Si substrate 14 having a thickness of 500 micrometers. An HgCdTe layer 7 having a thickness of 10 micrometers is provided on the CdTe buffer layer 13. Photodiodes 5 and 16 are provided on a surface of the HgCdTe layer 7 to form a two dimensional array of 256×256 of photodiodes. The Si substrates 9 and 14 have a size of 1×1 cm$^2$. The photodiodes 16 represent photodiodes positioned at peripheral edges of the two dimensional arrays. In bumps 6 are provided on the photodiodes 5 and 16. Polysilicon bumps 15 are provided to be bonded with the In bumps 6, wherein the polysilicon bumps 15 are embedded within the In bumps 6. CdTe bumps 8 are further provided on the surface of the HgCdTe layer 7. The CdTe bumps 8 are positioned outside the two dimensional arrays of the photodiodes 5 and 16. Reinforcement polysilicon bumps 12 are provided to be bonded with the CdTe bumps 8. An Si substrate 9 having integrated circuits is bonded to the Si substrate 14 via the polysilicon bumps 10, the In bumps 6, the reinforcement polysilicon bumps 12 and the CdTe bumps 8.

As illustrated in FIG. 6A, before the bonding between the Si substrates 9 and 14, the CdTe bumps 8 having a thickness of 1 micrometer are provided by evaporation on the surface of the HgCdTe layer 7 at the peripheral end potions. The In bumps 6 having a thickness of 6 micrometers are provided on the photodiods 5. The reinforcement polysilicon bumps 12 are provided on the surface of the Si substrate 9 at corresponding positions to the CdTe bumps 8. The polysilicon bumps 10 highly doped to have a reduced resistivity are provided on the surface of the Si substrate 9 at corresponding positions to the photodiodes 5. The polysilicon bumps 10 have a thickness of 3 micrometers. The reinforcement polysilicon bumps 12 and the polysilicon bumps 10 are coated with In thin films 11 having a thickness of 0.5 micrometers. The In thin films 11 are formed by evaporation. The reinforcement polysilicon bumps 12 have a larger area four times or more than the polysilicon bumps 10.

As illustrated in FIG. 6B, the Si substrates 14 and 9 are bonded to each other under a pressures via the In bumps 6, the CdTe bumps 8, the polysilicon bumps 10 and the reinforcement polysilicon bumps 12. The In bumps are deformed to surround the polysilicon bumps 10 but not to extend to the edge of each the photodiodes 5. The In thin films 11 are broken so that the In bumps 6 are bonded directly to the polysilicon bumps 10.

The above bumps 6 and 10 have small aspect ratios which ensure a strong bonding and a large electrical conductivity. The above bumps 8 and 12 serve to relax the compression stress.

The above hybrid infrared ray detector is cooled at a temperature of 77K in use. The polysilicon bumps 10 and 12 have low flexibility. This prevents bending of the Si substrates 9 and 14. Thermal stress concentrations appear in a thermal stress maximum region 4 within the CdTe buffer layer 13. A thermal stress of 24×10$^6$ N/m$^2$ is generated in the thermal stress maximum region 4. This thermal stress of 24×10$^6$ N/m$^2$ is less than the critical value of the crystal deformation of CdTe. Then, no crystal deformation is generated in the thermal stress maximum region 4 within the CdTe buffer layer 13.

The photodiodes 5 receive the thermal stress of 24×10$^6$ N/m$^2$ which is about one half of the maximum value of the elastic limitation of HgCdTe For this reason, the photodiodes receive almost no damage due to the thermal stress caused by the cooling of the hybrid infrared ray detector in use.

Further, the CdTe bumps 8 and the reinforcement polysilicon bumps 12 prevent generation of a compression stress which is caused locally in the photodiodes 16 positioned at the peripheral region. If, however, neither reinforcement polysilicon bump nor CdTe bumps are provided, then a large compression stress of about $40 \times 10^6$ N/m$^2$ is generated at the photodiodes 16 positioned at the peripheral region. This compression stress value of $40 \times 10^6$ N/m$^2$ is above the maximum value of the elastic limitation of HgCdTe, generating crystal deformation in the photodiode. The CdTe bumps 8 and the reinforcement polysilicon bumps 12 prevents any crystal deformation of the HgCdTe photodiode and suppress the thermal stress applied to the photodiodes 16 at about $12 \times 10^6$ N/m$^2$. The CdTe bumps 8 and the reinforcement polysilicon bumps 12 make not only the photodiodes 5 but also the photodiodes 16 free from any deterioration due to the excess thermal stress. Although a thermal stress is also caused on the interface between the CdTe bumps 8 and the reinforcement polysilicon bumps 12, the thermal stress is $14 \times 10^6$ N/m$^2$ to $15 \times 10^6$ N/m$^2$, which causes no crystal deformation of HgCdTe.

The above bonding structure is applicable to substrates of various sizes, and also applicable to any hybrid infrared ray detectors of various compound semiconductors.

The above hybrid infrared ray detector may be fabricated as follows. The Si substrate 14 is prepared, which has almost the same thickness as the Si substrate 9 having the integrated circuits. The Si bumps 10 highly doped are formed on the Si substrate 9. The polysilicon bumps 12 are subsequently formed on the Si substrate 9. The In bumps 6 are formed on the photodiodes 5. The CdTe bumps 8 are formed on the HgCdTe layer 7. The In thin films 11 are formed to coat the Si bumps 10 and the polysilicon bumps 12. The substrates 9 and 14 are pressed to each other under a pressure to bond them.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A hybrid infrared ray detector comprising:

a first semiconductor substrate having a first thickness and a first elastic coefficient;

a buffer layer being provided on said first semiconductor substrate, said buffer layer being made of a first compound semiconductor having a second elastic coefficient larger than said first elastic coefficient, said buffer layer having a second thickness smaller than said first thickness;

an epitaxial layer being provided on said buffer layer, said epitaxial layer being made of a second compound semiconductor having a third elastic coefficient smaller than said second elastic coefficient and larger than said first elastic coefficient, said epitaxial layer having a third thickness being almost the same as said second thickness;

two-dimensional arrays of photodiodes being provided on a surface of said epitaxial layer;

first bumps being provided on said photodiodes;

second bumps being provided on said surface of said epitaxial layer, said second bumps being positioned outside said two-dimensional arrays of said photodiodes; and a second semiconductor substrate having integrated circuits, said second semiconductor substrate having third bumps positioned to correspond to said first bumps and fourth bumps positioned to correspond to said second bumps, said second semiconductor substrate being bonded via said first to fourth bumps to said epitaxial layer, said second semiconductor substrate having a fourth thickness being almost the same as said first thickness, said second semiconductor substrate having a fourth elastic coefficient being almost the same as said first elastic coefficient, wherein said first to fourth thickness and said first to fourth elastic coefficients are so determined that a thermal stress caused by cooling said hybrid infrared ray detector in operation is concentrated within said buffer layer.

2. The hybrid infrared ray detector as claimed in claim 1, wherein said first and second semiconductor substrates are made of silicon.

3. The hybrid infrared ray detector as claimed in claim 1, wherein said buffer layer is made of CdTe.

4. The hybrid infrared ray detector as claimed in claim 1, wherein said epitaxial layer is made of HgCdTe.

5. The hybrid infrared ray detector as claimed in claim 1, wherein said first bumps are made of In.

6. The hybrid infrared ray detector as claimed in claim 1, wherein said second bumps are made of CdTe.

7. The hybrid infrared ray detector as claimed in claim 1, wherein said third and fourth bumps are made of polysilicon highly doped.

8. The hybrid infrared ray detector as claimed in claim 7, wherein said third and fourth bumps are coated with thin films made of In.

9. The hybrid infrared ray detector as claimed in claim 1, wherein said second and fourth bumps have areas which are four times larger than areas of said first and third bumps.

10. A hybrid infrared ray detector comprising:

two semiconductor substrates of substantially the same first elastic coefficient and substantially the same first thickness;

a buffer layer on one of said two substrates having a second elastic coefficient larger than said first elastic coefficient and a second thickness substantially less than said first thickness;

a detector layer on said buffer layer and bonded to the other of said two substrates, said detector layer having plural photodiodes thereon; and said first thickness being sufficiently large to focus a thermal stress caused by cooling the detector almost entirely within said buffer layer while avoiding crystal deformation of said buffer layer.

11. The detector of claim 10, wherein said first thickness is about 500 micrometers and said second thickness is about 20 micrometers.

12. The detector of claim 10, wherein said detector layer has a thickness approximating said second thickness and an elastic coefficient between said first and second elastic coefficients.

13. The detector of claim 10, further comprising reinforcement bonds adjacent an edge of said other substrate and exterior to a periphery of said plural photodiodes for rigidly bonding said detector layer to said other substrate.

14. The detector of claim 10, wherein said buffer layer is rigidly affixed to said one substrate and to said detector layer, and said detector layer is rigidly affixed to said other substrate to facilitate focusing the thermal stress.

* * * * *